(12) United States Patent
Shimomura

(10) Patent No.: US 9,666,755 B2
(45) Date of Patent: May 30, 2017

(54) METHOD OF MANUFACTURING SEALED BODY AND METHOD OF MANUFACTURING LIGHT-EMITTING DEVICE

(71) Applicant: Semiconductor Energy Laboratory Co., Ltd., Kanagawa-ken (JP)

(72) Inventor: Akihisa Shimomura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 134 days.

(21) Appl. No.: 13/687,354

(22) Filed: Nov. 28, 2012

(65) Prior Publication Data

US 2013/0137200 A1    May 30, 2013

(30) Foreign Application Priority Data

Nov. 29, 2011 (JP) .................... 2011-260826

(51) Int. Cl.
*H01L 33/00* (2010.01)
*H01L 51/52* (2006.01)

(52) U.S. Cl.
CPC ...... *H01L 33/0095* (2013.01); *H01L 51/5246* (2013.01)

(58) Field of Classification Search
CPC ............ H01L 51/5237; H01L 51/5246; H01L 51/5271; H01L 21/50; H01L 21/67126; H01L 21/67376; H01L 2924/163; H01L 2924/1631; H01L 2924/16315; H01L 2924/164; H01L 2924/16588; H01L 2924/173; H01L 2924/17151; H01L 2224/252; H01L 2224/85214; H01L 2224/24939; H01L 2224/86039; H01L 2224/85939; H01L 2224/85916; H01L 2933/005; H01L 33/0095; H01L 2924/183; H01L 2924/1815; C03C 27/06
USPC ................ 438/26, 72; 313/504, 506; 445/24
See application file for complete search history.

(56) References Cited

U.S. PATENT DOCUMENTS

| 6,113,450 | A | 9/2000 | Narayanan et al. |
| 6,639,359 | B1 | 10/2003 | Chae |
| 6,646,284 | B2 | 11/2003 | Yamazaki et al. |
| 6,803,246 | B2 | 10/2004 | Yamazaki et al. |
| 6,860,780 | B2 | 3/2005 | Miyashita et al. |
| 6,984,159 | B1 | 1/2006 | Kado et al. |

(Continued)

FOREIGN PATENT DOCUMENTS

| JP | 10-134959 | 5/1998 |
| JP | 11-329717 | 11/1999 |

(Continued)

*Primary Examiner* — Natalia Gondarenko
(74) *Attorney, Agent, or Firm* — Husch Blackwell LLP

(57) ABSTRACT

Methods of manufacturing a sealed body and a light-emitting device with high airtightness in which generation of a crack in a substrate and a frit glass in an overlap region where laser light irradiation is started and ended is prevented are provided. A high-reflectivity region having high reflectivity with respect to laser light and a low-reflectivity region having lower reflectivity than the high-reflectivity region are provided in a region which overlaps with the frit glass and is over a substrate facing a substrate on which the frit glass is formed. When scanning with laser light is started from the low-reflectivity region, a crack is less likely to be generated in the frit glass.

15 Claims, 12 Drawing Sheets

(56) References Cited

U.S. PATENT DOCUMENTS

| | | |
|---|---|---|
| 6,998,776 B2 | 2/2006 | Aitken et al. |
| 7,121,642 B2 | 10/2006 | Stoessel et al. |
| 7,407,423 B2 | 8/2008 | Aitken et al. |
| 7,431,628 B2 | 10/2008 | Park et al. |
| 7,538,488 B2 * | 5/2009 | Kwak ................. H01L 51/5246 313/506 |
| 7,602,121 B2 | 10/2009 | Aitken et al. |
| 7,701,136 B2 | 4/2010 | Kwak |
| 7,780,493 B2 | 8/2010 | Choi et al. |
| 7,837,530 B2 | 11/2010 | Park |
| 7,841,919 B2 | 11/2010 | Lee et al. |
| 7,863,207 B2 | 1/2011 | Son et al. |
| 7,868,540 B2 | 1/2011 | Kim |
| 7,871,949 B2 | 1/2011 | Lee et al. |
| 7,944,143 B2 | 5/2011 | Choi et al. |
| 8,063,560 B2 | 11/2011 | Aitken et al. |
| 8,120,249 B2 | 2/2012 | Choi et al. |
| 8,125,146 B2 | 2/2012 | Park |
| 8,164,257 B2 | 4/2012 | Choi et al. |
| 8,192,188 B2 | 6/2012 | Kim |
| 9,150,450 B2 | 10/2015 | Becken et al. |
| 2004/0207314 A1 | 10/2004 | Aitken et al. |
| 2005/0168129 A1 | 8/2005 | Chi |
| 2007/0170455 A1 | 7/2007 | Choi et al. |
| 2007/0170854 A1 | 7/2007 | Kwak |
| 2009/0001871 A1 | 1/2009 | Song |
| 2010/0078646 A1 | 4/2010 | Sumita et al. |
| 2010/0079065 A1 | 4/2010 | Kamiura |
| 2010/0096984 A1 | 4/2010 | Kim |
| 2010/0126898 A1 | 5/2010 | Becken et al. |
| 2011/0018430 A1 * | 1/2011 | Kang et al. ................. 313/504 |
| 2011/0121352 A1 * | 5/2011 | Hesse ................. H01L 27/301 257/99 |
| 2011/0193116 A1 * | 8/2011 | Fukuda ........................ 257/98 |
| 2013/0048967 A1 | 2/2013 | Nishido et al. |
| 2013/0049062 A1 | 2/2013 | Hatano et al. |
| 2013/0134570 A1 | 5/2013 | Nishido |

FOREIGN PATENT DOCUMENTS

| | | |
|---|---|---|
| JP | 2007-140061 | 6/2007 |
| JP | 2008-527655 | 7/2008 |
| JP | 2008-527657 | 7/2008 |
| JP | 2010-80339 | 4/2010 |
| JP | 2011-18479 | 1/2011 |
| JP | 2011-54477 | 3/2011 |
| JP | 2011-65895 | 3/2011 |
| JP | 2011-70797 | 4/2011 |
| WO | WO 2007/067533 A2 | 6/2007 |

* cited by examiner

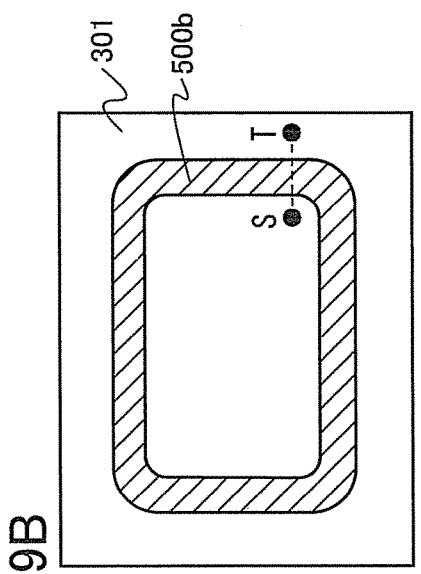
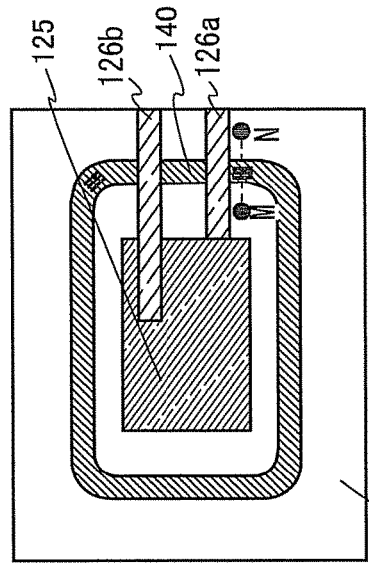
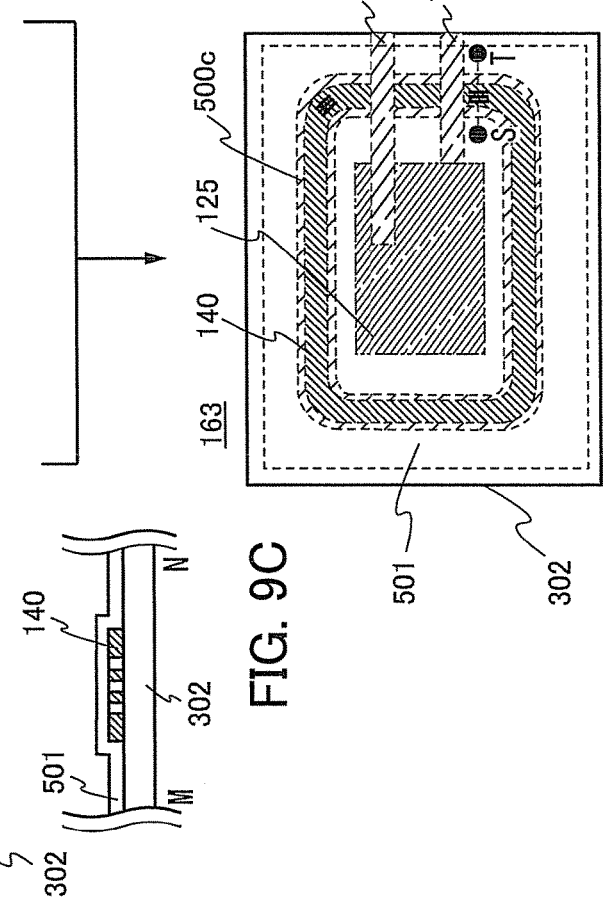
FIG. 9A
FIG. 9B
FIG. 9C

METHOD OF MANUFACTURING SEALED BODY AND METHOD OF MANUFACTURING LIGHT-EMITTING DEVICE

BACKGROUND OF THE INVENTION

1. Field of the Invention

The present invention relates to methods of manufacturing a sealed body and a light-emitting device that can be protected from impurities from the outside.

2. Description of the Related Art

Frit glass sealing is known as a technique of sealing a space formed by two bonded glass substrates. A sealed body using frit glass sealing has high airtightness, and is applied to an organic electroluminescence (hereinafter referred to as EL) display device, a liquid crystal display device, a plasma display device, and the like.

Frit glass sealing is used particularly in an organic EL display device so that reliability of an organic EL element is improved. This is because reliability of the organic EL element is rapidly reduced when an organic EL layer and electrodes between which the organic EL layer is interposed are exposed to moisture or oxygen. As a sealing technique using frit glass for preventing exposure of an organic EL layer and electrodes to the air, for example, the technique described in Patent Document 1 is known.

In the technique described in Patent Document 1, a frit glass paste is scanned along an edge of a glass substrate while being discharged from a nozzle, whereby a partition is formed into a closed curve line of the frit glass paste. After that, baking is performed so that the frit glass paste is fused to be a frit glass. Further, the frit glass is pressed against the other glass substrate, and the frit glass is heated and melted by laser light irradiation; thus, the frit glass is welded to the other glass substrate. In such a manner, a highly airtight sealed body is formed.

However, in some cases, a frit glass sealed body has a region in which a crack is easily generated when conditions of laser light irradiation (e.g., irradiation intensity and scanning speed of laser light) are not adjusted, which results in low airtightness. For example, in an overlap region where laser light irradiation is started and ended, a crack is easily generated when the region is irradiated with the same laser light power as scanned regions other than the overlap region. The reason of this is as follows: the amount of heat applied to the overlap region is larger than that to the scanned regions other than the overlap region, and the frit glass and the glass substrate in the overlap region are thermally expanded in comparison with those in the scanned regions other than the overlap region. As a countermeasure against this, conditions such as irradiation intensity and scanning speed of laser light in the overlap region are controlled in a complex manner (Patent Document 2).

REFERENCE

Patent Documents

[Patent Document 1] Japanese Published Patent Application No. 2011-065895
[Patent Document 2] Japanese Published Patent Application No. 2008-527655

SUMMARY OF THE INVENTION

In the above conventional method for preventing generation of a crack in the overlap region, conditions of laser light irradiation need to be controlled in a complex manner, which has been troublesome. Further, when the conditions of laser light irradiation are adjusted in a wrong manner, a crack is generated in the frit glass in the overlap region; thus, the yield of a sealed body is reduced.

In view of this, an object of the present invention is to provide methods of manufacturing a sealed body and a light-emitting device with high airtightness in which generation of a crack in a substrate and a frit glass in an overlap region where laser light irradiation is started and ended is prevented.

One embodiment of the present invention is a method of manufacturing a sealed body, including the steps of disposing a second substrate in contact with a frit glass containing a low-melting-point glass on a first substrate which faces the second substrate; and irradiating the fit glass with laser light to weld the frit glass to the second substrate. The frit glass is provided on a surface of the first substrate. In a region which overlaps with the frit glass and is over the second substrate, a high-reflectivity region having high reflectivity with respect to the laser light and a low-reflectivity region having lower reflectivity than the high-reflectivity region are provided. In a state where the frit glass is disposed between the first substrate and the second substrate, the frit glass is irradiated with the laser light to be melted, so that a closed space is formed by the frit glass, the first substrate, and the second substrate. Scanning with the laser light is started from the low-reflectivity region.

As modes in which the frit glass is heated with laser light, there are a mode in which the frit glass is directly heated with laser light passing through the first substrate and a mode in which the fit glass is heated with laser light which passes through the frit glass and is then reflected by an interface. The amount of laser light which is reflected by an interface and then enters the frit glass is affected by a film structure in a region which overlaps with the frit glass and is over the second substrate.

When the second substrate is not provided with a reflective layer, the amount of reflected laser light is not uniform. This is because film structures between the frit glass and the second substrate differ depending on where the frit glass is applied, and laser light is reflected by interfaces therebetween.

In one embodiment of the present invention, a reflective layer reflecting laser light is provided over the second substrate so as to overlap with the frit glass on the first substrate. Accordingly, among portions provided with the reflective layer, the amount of laser light which is reflected by the reflective layer and then enters the frit glass is almost uniform in the same substrate. Therefore, as for the conditions of laser light irradiation for welding the frit glass to the substrate in manufacture of a sealed body, the range of the conditions of laser light irradiation (e.g., irradiation intensity and scanning speed of laser light) that can be employed can be made wide by providing the reflective layer.

The amount of heat applied by laser light irradiation to the overlap region where the laser light irradiation is started and ended is larger than that to scanned regions other than the overlap region. This is because the overlap region is irradiated with laser light twice, i.e., at the time of starting and ending the laser light irradiation.

When heat the amount of which is large enough to weld the frit glass to the second substrate is applied to the frit glass, the frit glass and the second substrate are thermally expanded. Due to a difference in thermal expansion coefficient therebetween, a crack is generated in the frit glass. In the present invention, the low-reflectivity region having lower reflectivity with respect to laser light than the other regions is provided in the overlap region so that the amount of reflected laser light which enters the frit glass is reduced; thus, the amount of heat applied to the frit glass in the overlap region and that to the frit glass in the other regions can be substantially equal to each other. Therefore, a sealed body with high airtightness in which a crack is less likely to be generated in the frit glass in the overlap region can be provided.

Another embodiment of the present invention is a method of manufacturing a light-emitting device, including the steps of disposing a second substrate over which an organic EL element is formed, in contact with a frit glass containing a low-melting-point glass on a first substrate which faces the second substrate; and irradiating the frit glass with laser light to weld the frit glass to the second substrate. The frit glass is provided on a surface of the first substrate. In a region which overlaps with the frit glass and is over the second substrate, a high-reflectivity region having high reflectivity with respect to the laser light and a low-reflectivity region having lower reflectivity than the high-reflectivity region are provided. In a state where the frit glass is disposed between the first substrate and the second substrate, the frit glass is irradiated with the laser light to be melted, so that a closed space is formed by the frit glass, the first substrate, and the second substrate. Scanning with the laser light is started from the low-reflectivity region.

As modes in which the frit glass is heated with laser light, there are a mode in which the frit glass is directly heated with laser light passing through the first substrate and a mode in which the frit glass is heated with laser light which passes through the frit glass and is then reflected by an interface. The amount of laser light which is reflected by an interface and then enters the frit glass is affected by a film structure in a region which overlaps with the frit glass and is over the second substrate.

When the second substrate is not provided with a reflective layer, the amount of reflected laser light is not uniform. This is because film structures between the frit glass and the second substrate differ depending on where the frit glass is applied, and laser light is reflected by interfaces therebetween.

The reflective layer reflecting laser light is provided over the second substrate so as to overlap with the frit glass on the first substrate. Accordingly, the amount of laser light which is reflected by the reflective layer and then enters the frit glass is almost uniform in the same substrate. Therefore, as for the conditions of laser light irradiation for welding the frit glass to the substrate in manufacture of a light-emitting device, the range of the conditions of laser light irradiation (e.g., irradiation intensity and scanning speed of laser light) that can be employed can be made wide by providing the reflective layer.

The amount of heat applied by laser light irradiation to the overlap region where the laser light irradiation is started and ended is larger than that to scanned regions other than the overlap region. This is because the overlap region is irradiated with laser light twice, i.e., at the time of starting and ending the laser light irradiation.

When heat the amount of which is large enough to weld the frit glass to the second substrate is applied to the frit glass, the frit glass and the second substrate are thermally expanded. Due to a difference in thermal expansion coefficient therebetween, a crack is generated in the frit glass. In the present invention, the low-reflectivity region having lower reflectivity with respect to laser light than the other regions is provided in the overlap region so that the amount of reflected laser light which enters the frit glass is reduced; thus, the amount of heat applied to the frit glass in the overlap region and that to the frit glass in the other regions can be substantially equal to each other. Therefore, a light-emitting device with high airtightness in which a crack is less likely to be generated in the frit glass in the overlap region can be provided.

According to the present invention, methods of manufacturing a sealed body and a light-emitting device with high airtightness can be provided.

BRIEF DESCRIPTION OF THE DRAWINGS

FIGS. 9A to 9C show cross-sectional views and top views illustrating a manufacturing process of a light-emitting device according to one embodiment of the present invention.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed. Therefore, the invention disclosed in this specification is not construed as being limited to the description in the following embodiments.

Embodiment 1

In this embodiment, a method of manufacturing a sealed body according to one embodiment of the present invention will be described. A method of manufacturing a sealed body 161 in FIGS. 1A to 1C will be described with reference to FIG. 2, FIGS. 3A to 3D, FIGS. 4A to 4D, FIGS. 5A to 5D, and FIGS. 6A to 6C.

(Structure of Sealed Body)

Figure 1A:
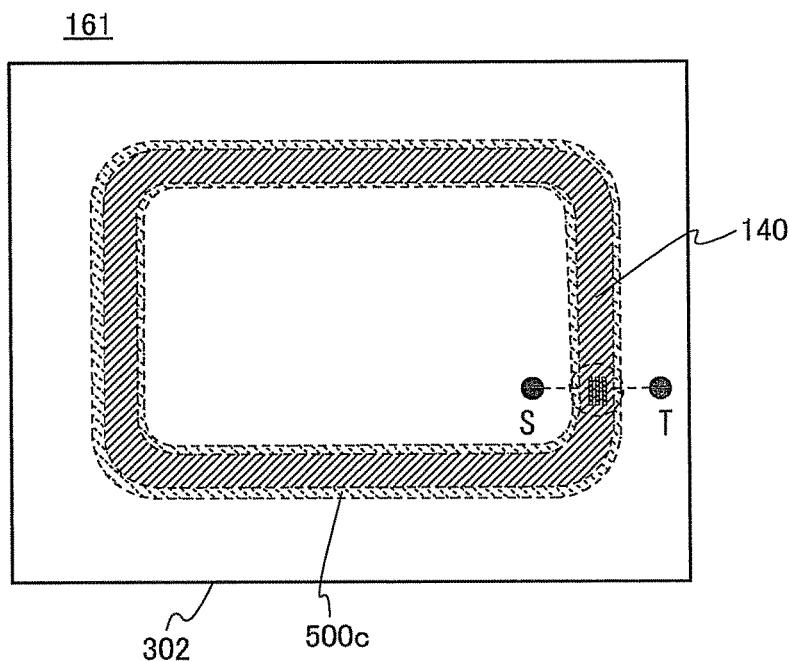
FIGS. 1A to 1C are top views and a cross-sectional view of a sealed body according to one embodiment of the present invention.
Figure 1B:
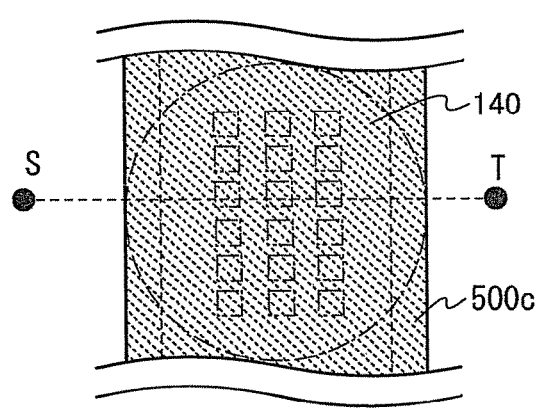
Figure 1C:
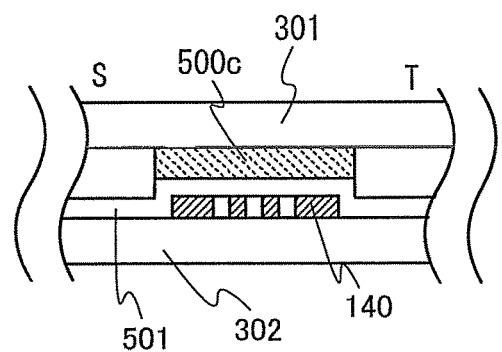

The sealed body 161 includes a first substrate 301, a second substrate 302, a frit glass layer 500c, a reflective layer 140, and an inorganic insulating layer 501. FIG. 1A is a top view of the sealed body 161. FIG. 1B is a top view in which part of the reflective layer 140 is enlarged, and FIG. 1C is a cross-sectional view taken along dotted line S-T in FIG. 1B. Note that double wave lines in FIGS. 1B and 1C show that some components are not illustrated here.

In this specification, a frit glass which has been applied as a frit glass paste to a substrate is defined as a frit glass layer 500a, a frit glass obtained by baking the frit glass layer 500a for removing a binder or the like is defined as a frit glass layer 500b, and a frit glass which has been welded to a substrate with a laser is defined as a frit glass layer 500c. A material for the frit glass layer 500a will be described in detail in the description of the method of manufacturing the sealed body.

As the first substrate 301, a substrate transmitting laser light may be used. This is because the frit glass layer 500b is irradiated with laser light through the first substrate 301. A glass substrate is preferably used as the first substrate 301.

Over the second substrate 302, a region overlapping with the frit glass layer 500b may be flat. This is for improving the airtightness of the sealed body. As the second substrate 302, a glass substrate or a metal substrate can be used.

The reflective layer 140 is formed over the second substrate 302. This is for heating the frit glass layer 500b by reflecting laser light passing through the frit glass layer 500b formed on the first substrate 301. The reflective layer 140 can be formed using a metal such as tungsten, tantalum, molybdenum, copper, or iron. In particular, the reflective layer 140 is preferably formed using tungsten.

The inorganic insulating layer 501 is preferably provided so as to cover the reflective layer 140. This is for preventing oxidation of a surface of the reflective layer 140. The inorganic insulating layer 501 can be formed using silicon oxide, silicon oxynitride, or silicon nitride.

(Method of Manufacturing Sealed Body)

Next, the method of manufacturing the sealed body 161 according to one embodiment of the present invention will be described with reference to FIG. 2, FIGS. 3A to 3D, FIGS. 4A to 4D, FIGS. 5A to 5D and FIGS. 6A to 6C.

(Application of Frit Glass)

Figure 2:
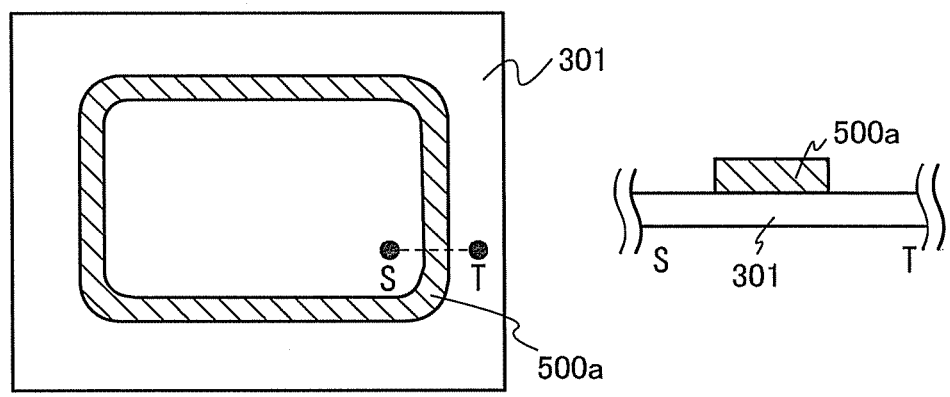
FIG. 2 shows a cross-sectional view and a top view illustrating a manufacturing process of a sealed body and a light-emitting device according to one embodiment of the present invention.

As illustrated in FIG. 2, the frit glass layer 500a is fainted into a continuous closed curve line over the first substrate 301. This is in order that the sealed body with high airtightness can be formed. The frit glass layer 500a includes a low-melting-point glass and a binder. The low-melting-point glass preferably contains at least one compound selected from, for example, magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass. A frit glass is prepared by mixing such a compound with a resin binder diluted with an organic solvent, for example. In order that the frit glass can be heated in the later-described laser light irradiation, a frit glass to which a laser light absorbent material is added is used. The laser absorbent material is selected as appropriate depending on the wavelength of the laser light used.

As a method of forming the frit glass layer 500a, a dispenser method, a screen printing method, or an inkjet method can be used. In this embodiment, the frit glass layer 500a has a substantially rectangular shape suitable for sealing of a display device or the like, but may have another shape such as a circular shape or an elliptical shape as long as it is formed into a closed curve line.

(Baking of Frit Glass)

Next, the frit glass layer 500a over the first substrate 301 is heated in order to vaporize the binder in the frit glass layer 500a. The first substrate 301 over which the frit glass layer 500a is formed may be subjected to heat treatment at 300° C. to 450° C. The heat treatment can be performed using a lamp, a heater, or the like. Through the heat treatment, the low-melting-point glass is melted and solidified to be welded.

(Formation of Reflective Layer)

Figure 3A:
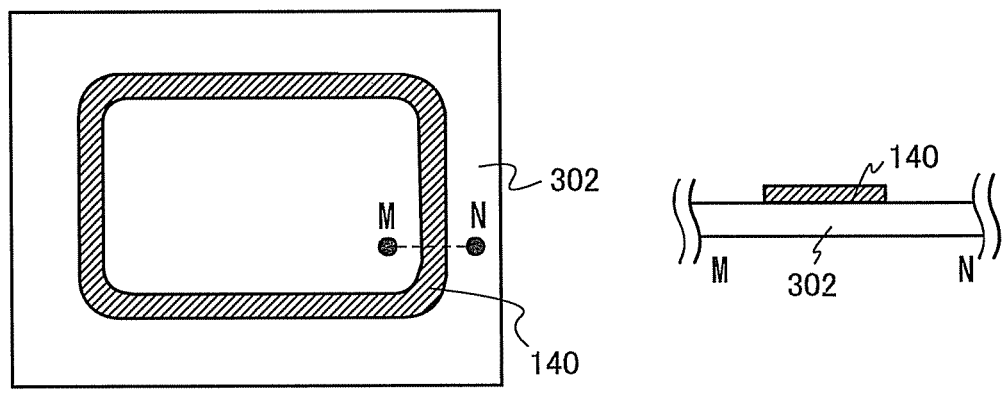
FIGS. 3A to 3D show cross-sectional views and top views illustrating a manufacturing process of a sealed body according to one embodiment of the present invention.

Then, the reflective layer 140 is formed over the second substrate 302. FIG. 3A shows a top view of the second substrate 302 over which the reflective layer 140 is formed. The reflective layer 140 is formed over the second substrate 302 so as to overlap with a region where the frit glass layer 500b is to be formed on the first substrate 301.

Figure 3B:
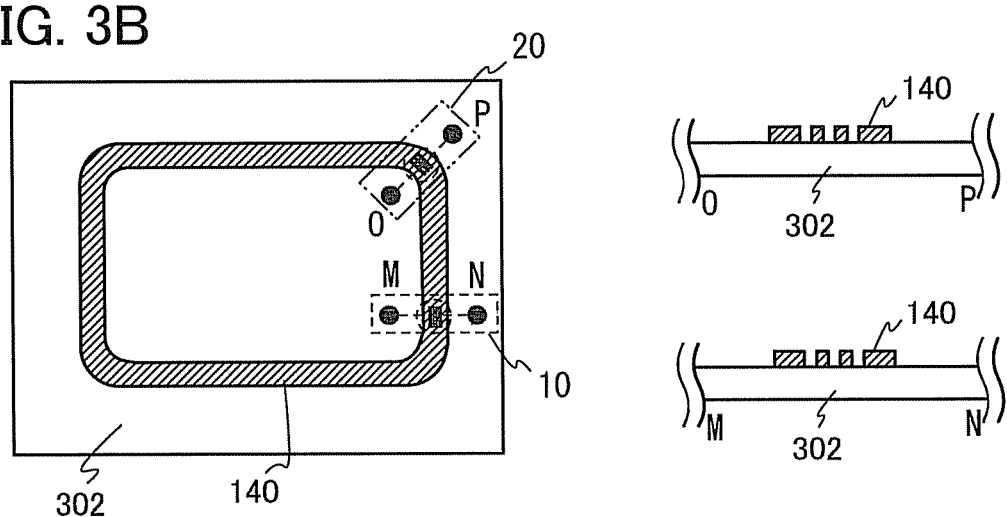
Figure 3C:
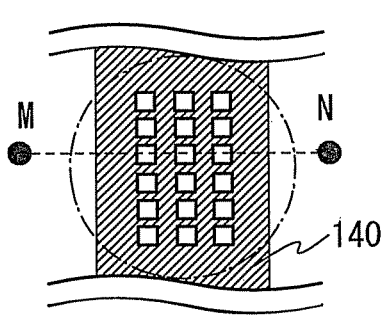
Figure 3D:
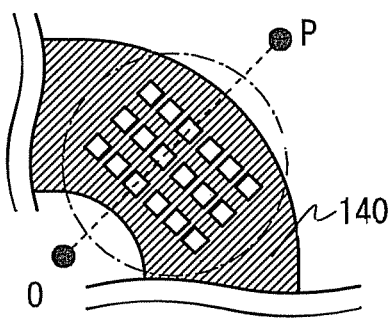

FIG. 3B shows a top view of the second substrate 302 over which a low-reflectivity region is provided in a region where laser light irradiation is started and ended in the reflective layer 140 (hereinafter, this region is referred to as an overlap region 10) and in a corner region 20 at the corner of the reflective layer 140. FIG. 3C and FIG. 3D are enlarged top views of the overlap region 10 and the corner region 20, respectively. A description of the corner region 20 will be made later.

Note that in this embodiment, the low-reflectivity region having lower reflectivity than a high-reflectivity region corresponds to the overlap region 10 and the corner region 20. The high-reflectivity region having high reflectivity corresponds to a region of the reflective layer 140 other than the overlap region 10 and the corner region 20.

A crack is easily generated in the frit glass layer 500c when the frit glass in the overlap region 10 is heated by laser light irradiation without adjusting irradiation intensity. The reason of this is as follows: since the amount of heat applied to the overlap region 10 is larger than that to scanned regions other than the overlap region 10, the frit glass layer 500c and the second substrate 302 are thermally expanded and thus a crack due to a difference in thermal expansion coefficient is easily generated.

In the manufacturing method according to one embodiment of the present invention, the reflectivity of the reflective layer 140 in the overlap region 10 with respect to laser light is made lower than that in the scanned regions other than the overlap region 10. Accordingly, the amount of heat applied to the overlap region 10 and that to the scanned regions other than the overlap region 10 can be substantially equal to each other without adjusting irradiation intensity. Therefore, a crack is less likely to be generated in the frit glass layer 500c in the overlap region 10, whereby the sealed body 161 can have high airtightness.

Figure 4A:
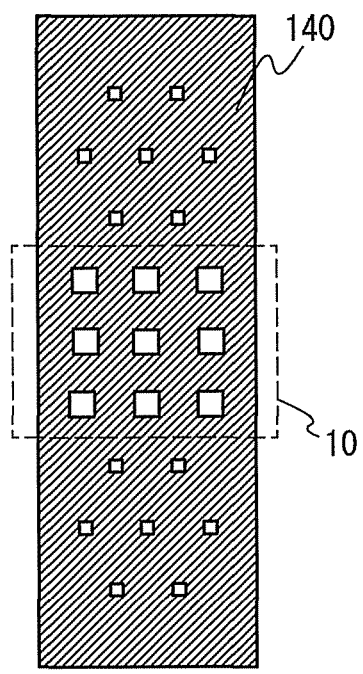
FIGS. 4A to 4D are top views each illustrating a mode of a reflective layer that can be used in a sealed body and a light-emitting device according to one embodiment of the present invention.
Figure 4B:
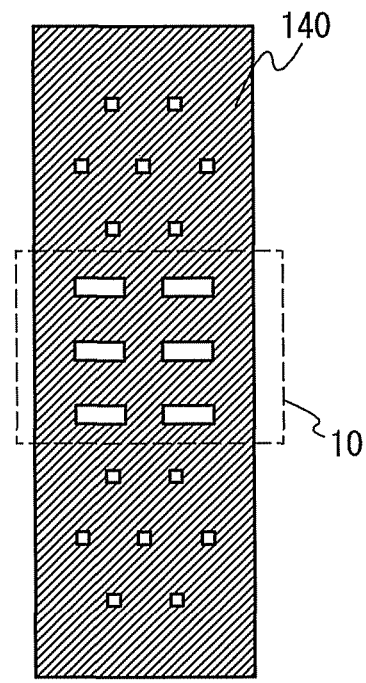
Figure 4C:
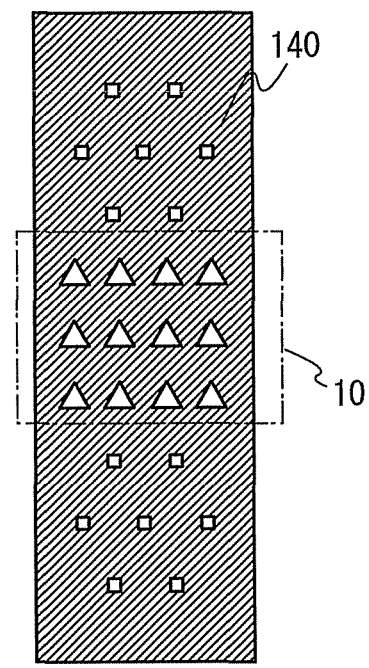
Figure 4D:
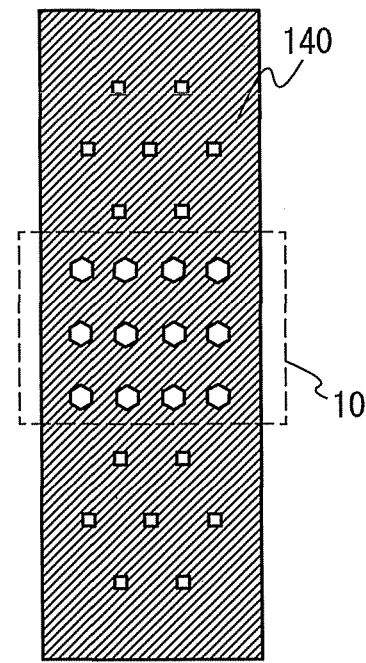

FIGS. 4A to 4D each illustrate an example of an upper surface pattern of the reflective layer 140 that can be used in the case of reducing the reflectivity of the reflective layer 140 with respect to laser light. In FIG. 4A, the area of the reflective layer 140 is made smaller by forming square holes in order to reduce the reflectivity of the overlap region 10 with respect to laser light. The shape of such a hole for reducing the area of the reflective layer 140 may be rectangular (FIG. 4B), triangular (FIG. 4C), or polygonal (FIG. 4D). The reflective layer 140 may have an appropriate form with which a crack is not generated in the frit glass layer 500c in the overlap region 10.

Figure 5A:
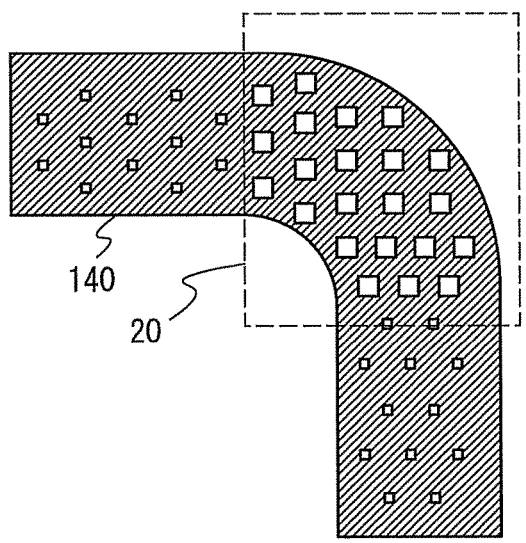
FIGS. 5A to 5D are top views each illustrating a mode of a reflective layer that can be used in a sealed body and a light-emitting device according to one embodiment of the present invention.
Figure 5B:
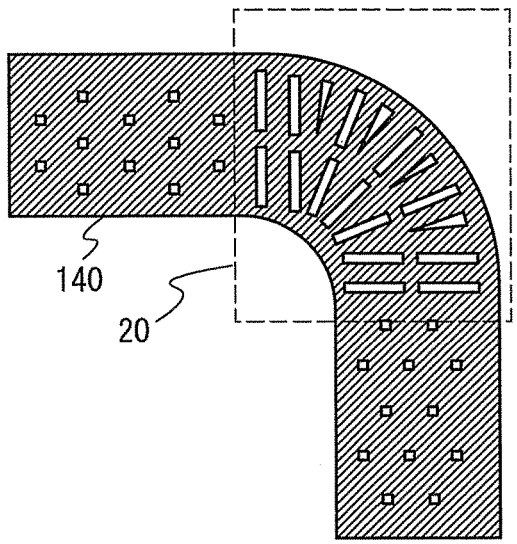
Figure 5C:
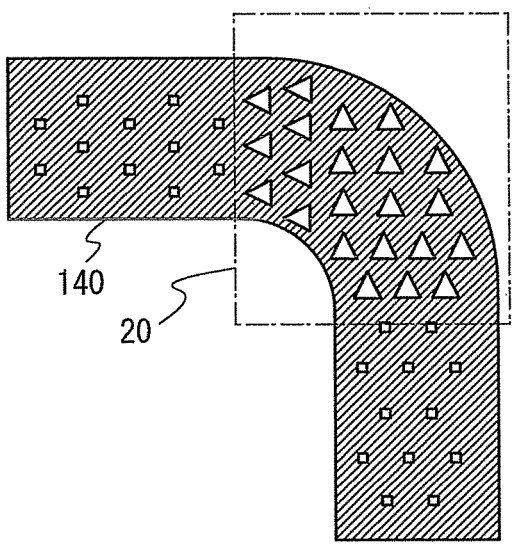
Figure 5D:
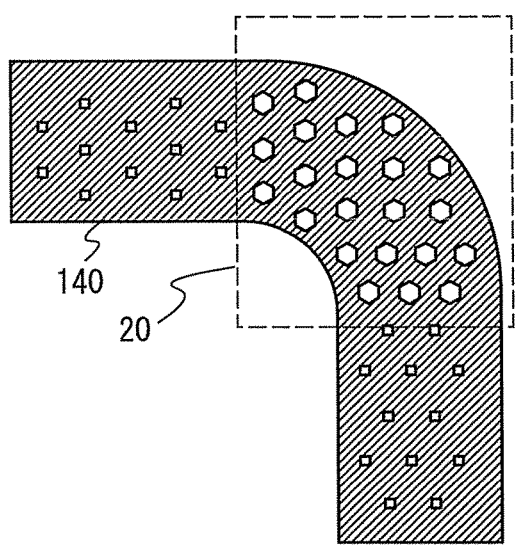

The reflective layer 140 in the corner region 20 also preferably has lower reflectivity than in the other regions. FIGS. 5A to 5D each illustrate an example of a pattern of the reflective layer 140 that can be used in the corner region. In FIG. 5A, the area of the reflective layer 140 is made smaller by forming square holes in order to reduce the reflectivity of the corner region 20 with respect to laser light. The shape of such a hole for reducing the area of the reflective layer 140 may be rectangular (FIG. 5B), triangular (FIG. 5C), or polygonal (FIG. 5D). The reflectivity of the reflective layer 140 in the corner region with respect to laser light can be reduced with such a pattern.

Although irradiation with laser light is performed at constant scanning speed, the amount of heat applied to an inner region of the corner region is larger than that to the other regions in some cases. This is because spots of laser light overlap with each other in the inner region of the corner region in comparison with those in an outer region of the corner region. The reflective layer 140 may have an appropriate form with which a crack is not generated in the frit glass layer 500c in the corner region 20.

The reflective layer 140 can be formed by a known technique; for example, the reflective layer 140 can be formed by etching with a resist mask formed using a photomask.

(Irradiation with Laser Light)

Figure 6B:
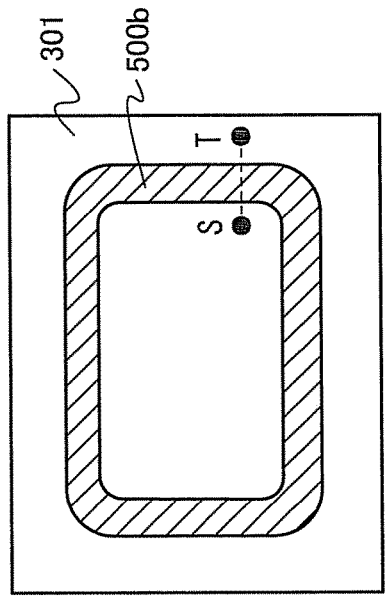
FIGS. 6A to 6C show cross-sectional views and top views illustrating a manufacturing process of a sealed body according to one embodiment of the present invention.
Figure 6A:
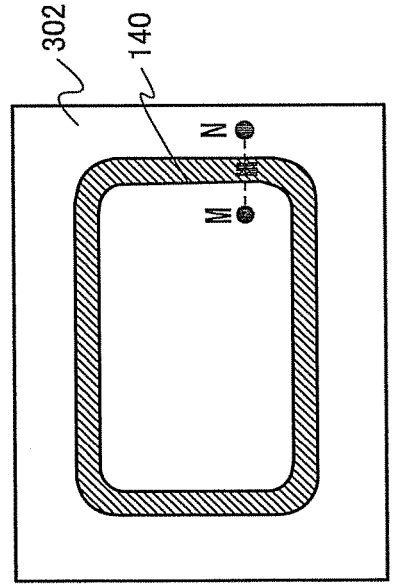
Figure 6C:
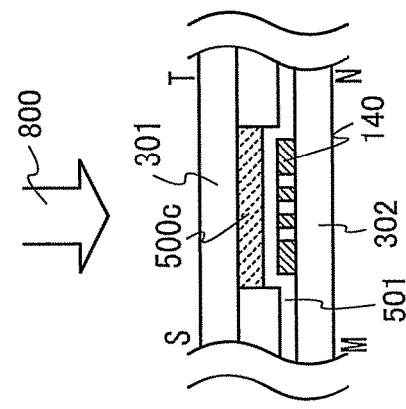
Figure 6C:
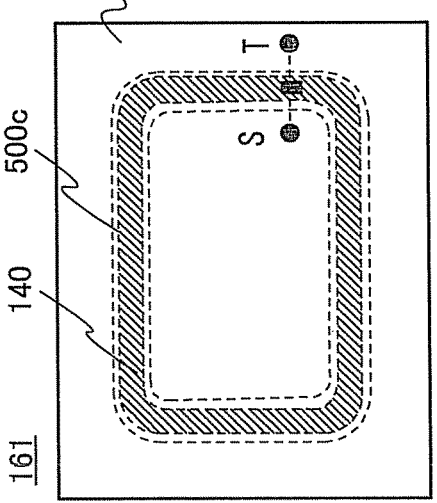

Next, the frit glass layer 500b over the first substrate 301 is made to be in close contact with the second substrate 302, and the frit glass layer 500b is irradiated with laser light 800. These steps are shown in FIGS. 6A to 6C. Consequently, the first substrate 301 and the second substrate 302 are bonded by melting of the frit glass layer 500b. The frit glass layer 500b is irradiated with the laser light 800 passing through the first substrate 301. The wavelength of the laser light used can be 750 nm to 1200 nm. Specifically, a 800-nm semiconductor laser is preferred.

As modes in which the frit glass layer 500b is heated with laser light, there are a mode in which the frit glass layer 500b is directly heated with laser light passing through the first substrate 301 and a mode in which the frit glass layer 500b is heated with laser light which passes through the frit glass layer 500b and is then reflected by an interface. The amount of laser light which is reflected by an interface and then enters the frit glass layer 500b is affected by a film structure in a region which overlaps with the frit glass layer 500b and is over the second substrate 302.

The reflective layer 140 reflecting laser light is provided over the second substrate 302 so as to overlap with the frit glass layer 500b on the first substrate 301. Accordingly, the amount of laser light which is reflected by the reflective layer 140 and then enters the frit glass layer 500b is almost uniform in the same substrate. Therefore, as for the conditions of laser light irradiation for welding the frit glass layer 500b to the second substrate 302 in manufacture of the sealed body 161, the range of the conditions of laser light irradiation (e.g., irradiation intensity and scanning speed of laser light) that can be employed can be made wide by providing the reflective layer 140.

The amount of heat applied by laser light irradiation to the overlap region 10 is larger than that to scanned regions other than the overlap region 10. This is because the overlap region 10 is irradiated with laser light twice, i.e., at the time of starting and ending the laser light irradiation.

When heat the amount of which is large enough to weld the frit glass layer 500b to the second substrate 302 is applied to the frit glass layer 500b, the frit glass layer 500b and the second substrate 302 are thermally expanded further. When they are thermally expanded further, a crack is generated in the frit glass layer 500b due to a difference in thermal expansion coefficient between the frit glass layer 500b and the second substrate 302. In the present invention, the low-reflectivity region having lower reflectivity with respect to laser light than the other regions is provided in the overlap region 10 so that the amount of reflected laser light which enters the frit glass layer 500b is reduced; thus, the amount of heat applied to the frit glass layer 500b in the overlap region 10 and that to the fit glass layer 500b in the other regions can be substantially equal to each other. Therefore, the sealed body 161 can have high airtightness in which a crack is less likely to be generated in the frit glass layer 500c in the overlap region 10.

Through the above steps, the sealed body 161 illustrated in FIGS. 1A to 1C can be manufactured.

As described above, with the method of manufacturing the sealed body 161 described in this embodiment, a crack is less likely to be generated in the frit glass. Accordingly, the sealed body 161 with high airtightness can be manufactured.

Embodiment 2

In this embodiment, a method of manufacturing a light-emitting device according to one embodiment of the present invention will be described. A method of manufacturing a light-emitting device 163 in FIGS. 7A to 7C will be described with reference to FIGS. 8A to 8C and FIGS. 9A to 9C.

(Structure of Light-Emitting Device)

Figure 7A:
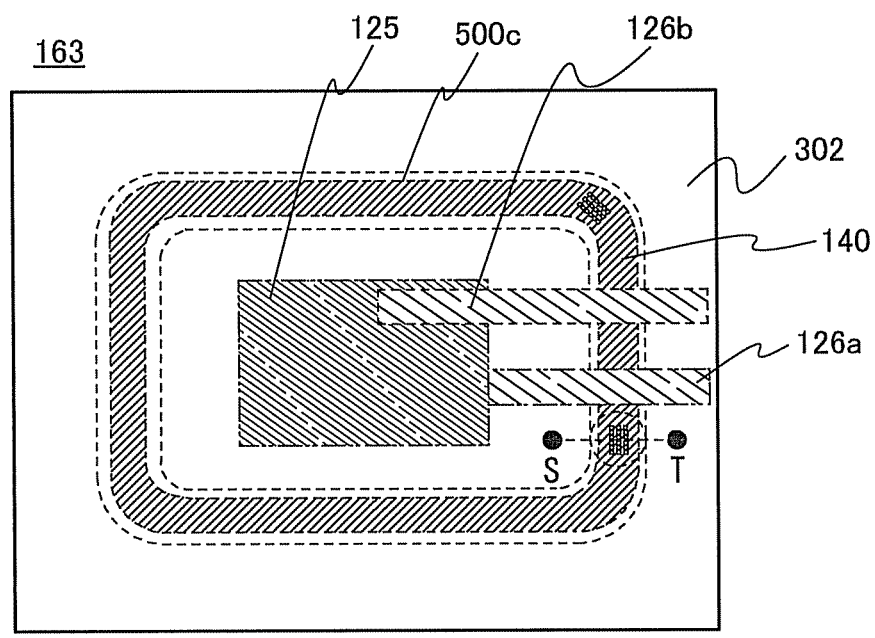
FIGS. 7A to 7C are top views and a cross-sectional view of a light-emitting device according to one embodiment of the present invention.
Figure 7B:
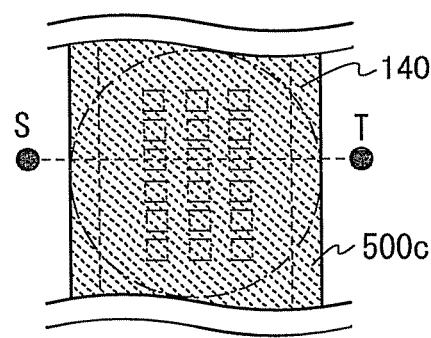
Figure 7C:
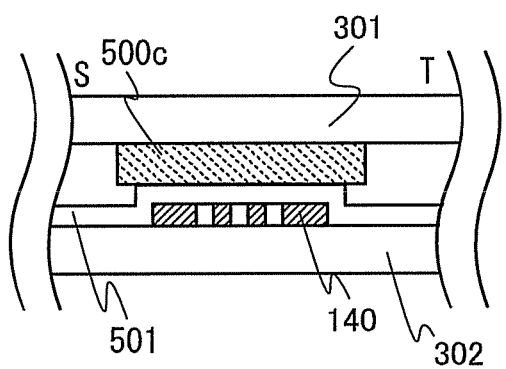

The light-emitting device 163 includes the first substrate 301, the second substrate 302, the fit glass layer 500c, the reflective layer 140, the inorganic insulating layer 501, an organic EL element 125, a terminal 126a, and a terminal 126b. FIG. 7A is a top view of the light-emitting device 163. FIG. 7B is a top view in which part of the reflective layer 140 is enlarged, and FIG. 7C is a cross-sectional view taken along dotted line S-T in FIG. 7B. Note that double wave lines in FIGS. 7B and 7C show that some components are not illustrated here.

In this specification, a frit glass which has been applied as a frit glass paste to a substrate is defined as the frit glass layer 500a, a frit glass obtained by baking the frit glass layer 500a for removing a binder or the like is defined as the frit glass layer 500b, and a frit glass which has been welded to a substrate with a laser is defined as the frit glass layer 500c. A material for the frit glass layer 500a is described in detail in the description of the method of manufacturing the sealed body.

As the first substrate 301, a substrate transmitting laser light may be used. This is because the frit glass layer 500b is irradiated with laser light through the first substrate 301. A glass substrate is preferably used as the first substrate 301.

Over the second substrate 302, a region overlapping with the frit glass layer 500b may be flat. This is for improving the airtightness of the light-emitting device. As the second substrate 302, a glass substrate or a metal substrate can be used.

The reflective layer 140 is formed over the second substrate 302. This is for heating the frit glass layer 500b by reflecting laser light passing through the frit glass layer 500b formed on the first substrate 301. The reflective layer 140 can be formed using a metal such as tungsten, tantalum, molybdenum, copper, or iron. In particular, the reflective layer 140 is preferably formed using tungsten.

The inorganic insulating layer 501 is preferably provided so as to cover the reflective layer 140. This is for preventing oxidation of a surface of the reflective layer 140. The inorganic insulating layer 501 can be formed using silicon oxide, silicon oxynitride, or silicon nitride.

(Method of Manufacturing Light-Emitting Device)

Next, the method of manufacturing the light-emitting device 163 according to one embodiment of the present invention will be described with reference to FIGS. 8A to 8C and FIGS. 9A to 9C.

(Application of Frit Glass)

The frit glass layer 500a is formed into a continuous closed curve line over the first substrate 301. Embodiment 1 can be referred to for the formation of the frit glass layer 500a.

(Baking of Frit Glass)

Next, the frit glass layer 500a over the first substrate 301 is heated in order to vaporize the binder in the frit glass layer 500a. Embodiment 1 can be referred to for the details of the heating method.

(Formation of Reflective Layer)

Figure 8A:
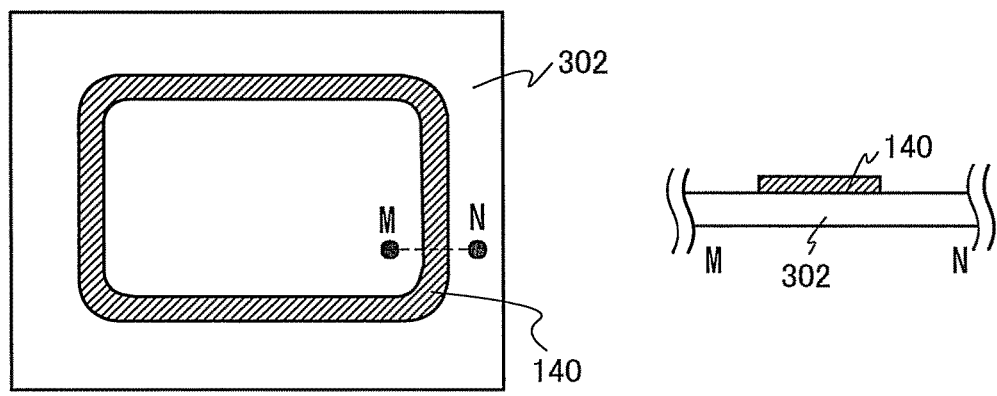
FIGS. 8A to 8C show cross-sectional views and top views illustrating a manufacturing process of a light-emitting device according to one embodiment of the present invention.

Then, the reflective layer 140 is formed over the second substrate 302. FIG. 8A shows a top view of the second substrate 302 over which the reflective layer 140 is formed. The reflective layer 140 is formed over the second substrate 302 so as to overlap with a region where the frit glass layer 500b is to be formed on the first substrate 301.

Figure 8B:
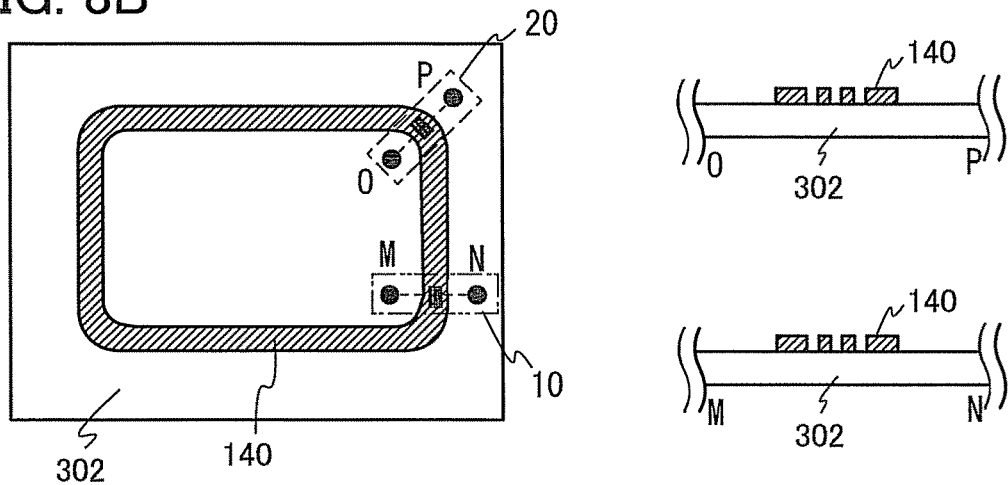

FIG. 8B shows a top view of the second substrate 302 over which a low-reflectivity region is provided in a region where laser light irradiation is started and ended in the reflective layer 140 (hereinafter, this region is referred to as the overlap region 10). In FIG. 8B, the low-reflectivity region is provided also in the corner region 20 at the corner of the reflective layer 140.

Note that in this embodiment, the low-reflectivity region having lower reflectivity than a high-reflectivity region corresponds to the overlap region 10 and the corner region 20. The high-reflectivity region having high reflectivity corresponds to a region of the reflective layer 140 other than the overlap region 10 and the corner region 20.

A crack is easily generated in the frit glass layer 500c when the frit glass in the overlap region 10 is heated by laser light irradiation without adjusting irradiation intensity. The reason of this is as follows: since the amount of heat applied to the overlap region 10 is larger than that to scanned regions other than the overlap region 10, the frit glass layer 500c and the second substrate 302 are thermally expanded and thus a crack due to a difference in thermal expansion coefficient is easily generated.

In the manufacturing method according to one embodiment of the present invention, the reflectivity of the reflective layer 140 in the overlap region 10 with respect to laser light is made lower than that in the scanned regions other than the overlap region 10. Accordingly, the amount of heat applied to the overlap region 10 and that to the scanned regions other than the overlap region 10 can be substantially equal to each other without adjusting irradiation intensity. Therefore, a crack is less likely to be generated in the frit glass layer 500c in the overlap region 10, whereby the light-emitting device 163 can have high airtightness.

FIGS. 4A to 4D each illustrate an example of an upper surface pattern of the reflective layer 140 that can be used in the case of reducing the reflectivity of the reflective layer 140 with respect to laser light. In FIG. 4A, the area of the reflective layer 140 is made smaller by forming square holes in order to reduce the reflectivity of the overlap region 10 with respect to laser light. The shape of such a hole for reducing the area of the reflective layer 140 may be rectangular (FIG. 4B), triangular (FIG. 4C), or polygonal (FIG. 4D). The reflective layer 140 may have an appropriate form with which a crack is not generated in the frit glass layer 500c in the overlap region 10.

The reflective layer 140 in the corner region 20 also preferably has lower reflectivity than in the other regions. FIGS. 5A to 5D each illustrate an example of a pattern of the reflective layer 140 that can be used in the corner region. In FIG. 5A, the area of the reflective layer 140 is made smaller by forming square holes in order to reduce the reflectivity of the corner region 20 with respect to laser light. The shape of such a hole for reducing the area of the reflective layer 140 may be rectangular (FIG. 5B), triangular (FIG. 5C), or polygonal (FIG. 5D). The reflectivity of the reflective layer 140 in the corner region with respect to laser light can be reduced with such a pattern.

Although irradiation with laser light is performed at constant scanning speed, the amount of heat applied to an inner region of the corner region is larger than that to the other regions in some cases. This is because spots of laser light overlap with each other in the inner region of the corner region in comparison with those in an outer region of the corner region. The reflective layer 140 may have an appropriate form with which a crack is not generated in the frit glass layer 500c in the corner region 20.

The reflective layer 140 can be formed by a known technique; for example, the reflective layer 140 can be formed by etching with a resist mask formed using a photomask.

Figure 8C:
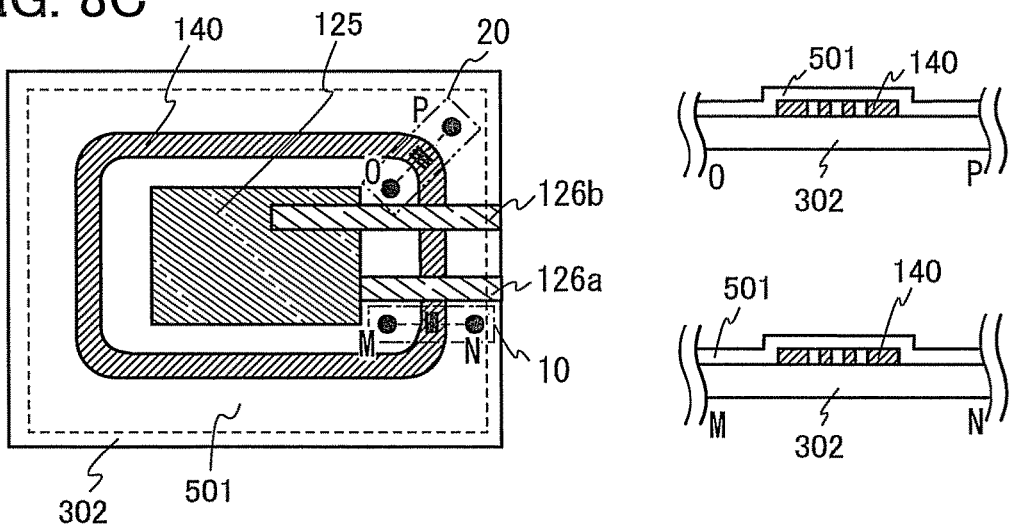

Next, the organic EL element 125 is formed over the second substrate 302. FIG. 8C is a top view of the second substrate 302 over which the organic EL element 125 is formed. The inorganic insulating layer 501 is preferably formed over the reflective layer 140 before the organic EL element 125 is formed. The structure of the organic EL element 125 will be described in Embodiment 3.

(Irradiation with Laser Light)

Next, the frit glass layer 500b over the first substrate 301 is made to be in close contact with the second substrate 302, and the frit glass layer 500b is irradiated with the laser light 800. These steps are shown in FIGS. 9A to 9C. Consequently, the first substrate 301 and the second substrate 302 are bonded by melting of the frit glass layer 500b. The frit glass layer 500b is irradiated with the laser light 800 passing through the first substrate 301. The wavelength of the laser light used can be 750 nm to 1200 nm. Specifically, a 800-nm semiconductor laser is preferred.

As modes in which the fit glass layer 500b is heated with laser light, there are a mode in which the frit glass layer 500b is directly heated with laser light passing through the first substrate 301 and a mode in which the frit glass layer 500b is heated with laser light which passes through the frit glass layer 500b and is then reflected by an interface. The amount of laser light which is reflected by an interface and then enters the frit glass layer 500b is affected by a film structure in a region which overlaps with the frit glass layer 500b and is over the second substrate 302.

The reflective layer 140 reflecting laser light is provided over the second substrate 302 so as to overlap with the frit glass layer 500b on the first substrate 301. Accordingly, the amount of laser light which is reflected by the reflective layer 140 and then enters the frit glass layer 500b is almost uniform in the same substrate. Therefore, as for the conditions of laser light irradiation for welding the fit glass layer 500b to the second substrate 302 in manufacture of the light-emitting device 163, the range of the conditions of laser light irradiation (e.g., irradiation intensity and scanning speed of laser light) that can be employed can be made wide by providing the reflective layer 140.

The amount of heat applied by laser light irradiation to the overlap region 10 is larger than that to scanned regions other than the overlap region 10. This is because the overlap region 10 is irradiated with laser light twice, i.e., at the time of starting and ending the laser light irradiation.

When heat the amount of which is large enough to weld the fit glass layer 500b to the second substrate 302 is applied to the frit glass layer 500b, the frit glass layer 500b and the second substrate 302 are thermally expanded further. When they are thermally expanded further, a crack is generated in the fit glass layer 500b due to a difference in thermal expansion coefficient between the frit glass layer 500b and the second substrate 302. In the present invention, the low-reflectivity region having lower reflectivity with respect to laser light than the other regions is provided in the overlap region 10 so that the amount of reflected laser light which enters the frit glass layer 500b is reduced; thus, the amount of heat applied to the frit glass layer 500b in the overlap region 10 and that to the frit glass layer 500b in the other regions can be substantially equal to each other. Therefore, the light-emitting device 163 can have high airtightness in which a crack is less likely to be generated in the frit glass layer 500c in the overlap region 10.

Through the above steps, the light-emitting device 163 illustrated in FIGS. 7A to 7C can be manufactured.

As described above, with the method of manufacturing the light-emitting device 163 described in this embodiment, a crack is less likely to be generated in the frit glass. Accordingly, the light-emitting device 163 with high airtightness can be manufactured.

Embodiment 3

Figure 10A:
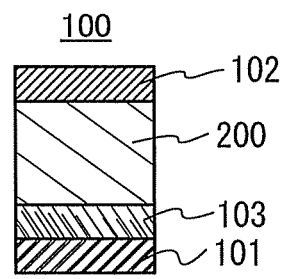
FIGS. 10A to 10C are cross-sectional views illustrating an organic EL element used in a light-emitting device according to one embodiment of the present invention.

In this embodiment, one mode of an organic EL element that can be used in a light-emitting device according to one embodiment of the present invention will be described with reference to FIG. 10A.

In this embodiment, an organic EL element 100 includes a first electrode 101, a light-transmitting conductive layer 103, an organic EL layer 200, and a second electrode 102. The light-transmitting conductive layer 103 is in contact with the first electrode 101. Note that in this embodiment, the following description will be made on the assumption that the first electrode 101 and the light-transmitting conductive layer 103 function as an anode and the second electrode 102 functions as a cathode. In other words, the following description will be made on the assumption that light emission can be obtained when voltage is applied between the first electrode 101 and the second electrode 102 such that the potential of the first electrode 101 is higher than that of the second electrode 102.

(First Electrode)

The first electrode 101 is an electrode that functions as an anode and as a reflective electrode. The thickness of the first electrode 101 is preferably 50 nm to 300 nm.

The first electrode 101 is preferably formed using a silver alloy. Copper, gold, palladium, neodymium, samarium, tin, indium, bismuth, or the like is preferably added to the silver alloy.

The first electrode 101 can be formed by a sputtering method or a screen printing method.

The first electrode 101 has high reflectivity with respect to light in the entire visible light region, so that a light-emitting element with high light extraction efficiency can be provided.

(Light-Transmitting Conductive Layer)

The light-transmitting conductive layer 103 is provided on and in contact with the first electrode 101. The light-transmitting conductive layer 103 has resistance to an acid solution, and thus functions as a protective film of the first electrode 101.

The thickness of the light-transmitting conductive layer 103 may be determined such that the first electrode 101 is not oxidized, and is typically greater than or equal to 1 nm and less than or equal to 100 nm, preferably greater than or equal to 5 nm and less than or equal to 10 nm.

As a material for the light-transmitting conductive layer 103, a metal oxide such as titanium oxide, tantalum oxide, tin oxide, indium oxide, a mixed oxide of indium oxide and tin oxide, a mixed oxide of indium oxide and zinc oxide, or a mixed oxide of silicon oxide and zinc oxide can be used. In particular, a layer containing titanium is preferably used for the light-transmitting conductive layer 103, and typically, a layer containing titanium oxide is preferably used. This is because titanium oxide has high resistance to an acid solution.

The light-transmitting conductive layer 103 can be formed by a sputtering method, a molecular beam epitaxy method, a pulsed laser deposition method, an atomic layer deposition method, or the like as appropriate. The light-transmitting conductive layer 103 can also be formed using a sputtering apparatus which performs deposition with surfaces of a plurality of substrates set substantially perpendicular to a surface of a sputtering target.

Titanium oxide may be formed in such a manner that titanium is formed over the first electrode 101 and then oxidized. For example, titanium oxide can be formed over the first electrode 101 containing silver in such a manner that a film of titanium is formed with a thickness of 6 nm by a sputtering method over the first electrode 101 and then heat treatment is performed at 300° C. for one hour in an air atmosphere. By such a method, a thin film of titanium oxide can be uniformly formed over the substrate.

(Second Electrode)

There is no particular limitation on the second electrode 102 as long as it can inject electrons into the organic EL layer 200 and has a light-transmitting property. This is because electrons are injected into the organic EL layer so that light emission from the organic EL layer can be extracted to the outside through the second electrode 102. As a material for the second electrode 102, a metal or a conductive metal oxide can be used. As the metal, aluminum or an alloy of silver and magnesium can be used. As the conductive metal oxide, a mixed oxide of indium oxide and tin oxide, a mixed oxide of indium oxide and zinc oxide, or any of the conductive metal oxide materials containing silicon or silicon oxide can be used. In the case where the metal is used, the thickness of the second electrode 102 is preferably greater than or equal to 1 nm and less than or equal to 10 nm in order that the second electrode 102 has a light-transmitting property. In order to improve the electron-injection property of the second electrode 102, an electron-injection layer containing an alkali metal such as lithium or cesium, an alkaline earth metal such as calcium or strontium, or magnesium is preferably provided between the second electrode 102 and the organic EL layer 200.

In the case where the second electrode 102 is formed using the metal, the second electrode 102 can be formed by a vacuum evaporation method, a sputtering method, or the like as appropriate.

In the case where the second electrode 102 is formed using the conductive metal oxide, the second electrode 102 can be formed by a sputtering method. The conductive metal oxide can be formed under an atmosphere containing argon and oxygen.

For the conductive metal oxide, a layered structure including a first conductive metal oxide formed under an atmosphere containing argon with reduced oxygen concentration and a second conductive metal oxide formed under an atmosphere containing argon and oxygen is preferably used. This is for reducing damage to the organic EL layer 200 due to the formation of the second electrode 102. In this case, in the formation of the first conductive metal oxide, it is preferable to use an argon gas with high purity, for example, an argon gas whose dew point is −70° C. or lower, more preferably −100° C. or lower.

(Organic EL Layer)

Figure 10B:
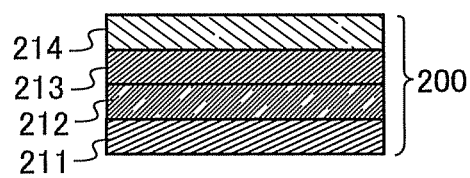

An organic EL layer that can be used as the organic EL layer 200 will be described with reference to FIG. 10B. The organic EL layer 200 described in this embodiment includes a hole-injection layer 211, a hole-transport layer 212, a light-emitting layer 213, an electron-transport layer 214, and the like. The hole-injection layer 211 is a layer containing a substance having a high hole-injection property. The hole-transport layer 212 is a layer containing a substance having a high hole-transport property. The light-emitting layer 213 is a layer containing a light-emitting material. The electron-transport layer 214 is a layer containing a substance having a high electron-transport property.

Although the organic EL layer 200 can be formed to have a single-layer structure, it is normally formed to have a layered structure. For example, the organic EL layer 200 can be formed by combining, as appropriate, the hole-injection layer 211, the hole-transport layer 212, the light-emitting layer 213, the electron-transport layer 214, and the like. FIG. 10B illustrates, as the organic EL layer 200, a structure in which the hole-injection layer 211, the hole-transport layer 212, the light-emitting layer 213, and the electron-transport layer 214 are sequentially stacked.

In order to suppress energy transfer from an exciton which is generated in the light-emitting layer 213, the hole-transport layer 212 or the electron-transport layer 214 which is in contact with the light-emitting layer 213, particularly a carrier- (electron- or hole-) transport layer in contact with a side closer to a light-emitting region in the light-emitting layer 213, is preferably formed using a substance having a larger energy gap than a light-emitting material contained in the light-emitting layer or an emission center substance contained in the light-emitting layer.

The hole-injection layer 211 contains a substance having a high hole-injection property, and has a function of helping injection of holes from the light-transmitting conductive layer 103 to the hole-transport layer 212. For the hole-injection layer 211, a substance which reduces a difference in ionization potential between the light-transmitting conductive layer 103 and the hole-transport layer 212 and thus makes hole injection easy, is selected. Specifically, it is preferable that the hole-injection layer 211 be formed to have a smaller ionization potential than the hole-transport layer 212 and a larger ionization potential than the light-transmitting conductive layer 103, or it is preferable that the hole-injection layer 211 be formed using a substance by which the energy band is bent when the substance is provided as a thin film with a thickness of 1 nm to 2 nm between the hole-transport layer 212 and the light-transmitting conductive layer 103.

The hole-transport layer 212 contains a substance having a high hole-transport property. Note that a substance having a high hole-transport property means a substance having higher hole mobility than electron mobility, and the ratio of hole mobility to electron mobility in the substance (=hole mobility/electron mobility) is preferably more than 100. The hole-transport layer 212 preferably has a hole mobility of $1 \times 10^{-6}$ cm$^2$/Vs or higher. Specifically, 4,4'-bis[N-(1-naphthyl)-N-phenylamino]biphenyl (abbreviation: NPB), copper phthalocyanine (abbreviation: CuPc), or the like can be used. Note that the hole-transport layer 212 may have a single-layer structure or a layered structure.

The electron-transport layer 214 contains a substance having a high electron-transport property. Note that a substance having a high electron-transport property means a substance having higher electron mobility than hole mobility, and the ratio of electron mobility to hole mobility (=electron mobility/hole mobility) in the substance is preferably more than 100. The electron-transport layer 214 preferably has an electron mobility of $1 \times 10^{-6}$ cm$^2$/Vs or higher. Specifically, a metal complex having a quinoline skeleton, a metal complex having a benzoquinoline skeleton, a metal complex having an oxazole-based ligand, or a metal complex having a thiazole-based ligand can be used. A specific example of a metal complex having a quinoline skeleton includes tris(8-quinolinolato)aluminum (abbreviation: Alq). As a specific example of a metal complex having a benzoquinoline skeleton, bis(10-hydroxybenzo[h]quinolinato)beryllium (abbreviation: BeBq$_2$) is given. As a specific example of a metal complex having an oxazole-based ligand, bis[2-(2-benzoxazolyl)phenolato]zinc (abbreviation: Zn(BOX)$_2$) is given. As a specific example of a metal complex having a thiazole-based ligand, bis[2-(2-benzothiazolyl)phenolato]zinc (abbreviation: Zn(BTZ)$_2$) is given. In addition to the metal complexes, bathophenanthroline (abbreviation: BPhen), bathocuproine (BCP), or the like can be used. The substances specifically listed above are mainly substances having an electron mobility of $1 \times 10^{-6}$ cm$^2$/Vs or higher. Note that any substance other than the above substances may be used for the electron-transport layer 214 as long as the electron-transport property is higher than the hole-transport property. Further, the electron-transport layer 214 may have a single-layer structure or a layered structure.

Further, a layer for controlling transport of electron carriers may be provided between the light-emitting layer 213 and the electron-transport layer 214. Note that the layer for controlling transport of electron carriers is a layer obtained by adding a small amount of substance having a high electron-trapping property to the above-described material having a high electron-transport property. By providing the layer for controlling transport of electron carriers, transfer of electron carriers can be suppressed and carrier balance can be adjusted. Such a structure is very effective in preventing a problem (such as reduction in element lifetime) caused when electrons pass through the light-emitting layer.

Between the electron-transport layer 214 and the second electrode 102, an electron-injection layer may be provided in contact with the second electrode 102. As the electron-injection layer, a layer which includes a substance having an electron-transport property and an alkali metal, an alkaline earth metal, a halide of the alkali metal, or a halide of the alkaline earth metal may be used. As the alkali metal or the alkaline earth metal, lithium, magnesium, cesium, or calcium can be used. As the halide of the alkali metal or the halide of the alkaline earth metal, lithium fluoride, cesium fluoride, or calcium fluoride can be used. Specifically, a layer of Alq containing magnesium can be used. By providing the electron-injection layer, electrons can be efficiently injected from the second electrode 102.

Any of various methods can be employed for forming the organic EL layer 200 regardless of whether it is a dry process or a wet process.

As described above, in the organic EL element 100 described in this embodiment, the light-transmitting conductive layer 103 is provided in contact with the first electrode 101. Since the light-transmitting conductive layer 103 has resistance to an acid solution, oxidation of the first electrode 101 can be prevented. Therefore, a reduction in reflectivity of the first electrode 101 can be prevented. As a result, a light-emitting element with high light extraction efficiency can be provided.

In the case where the light-transmitting conductive layer 103 contains titanium, oxidation of the first electrode 101 can be prevented because the light-transmitting conductive layer 103 containing titanium has high resistance to an acid solution. As a result, the reflectivity of the first electrode 101 is not reduced; thus, a light-emitting element with high light extraction efficiency can be provided.

When a layer having a semi-reflective and semi-transmitting property with respect to light in the visible light region is used for the second electrode 102, the light-emitting element can have a microcavity structure with the first electrode 101 and the second electrode 102. The first electrode 101 has high reflectivity with respect to light in the entire visible light region. Therefore, even with a microcavity structure with which the efficiency of extracting light having a specific wavelength is improved, the efficiency of extracting light having a desired wavelength in the visible light region can be improved.

When an alloy layer containing magnesium and silver is used for the second electrode 102, the driving voltage of the light-emitting element can be reduced because the alloy layer containing magnesium and silver is excellent in electron-injection property. Further, since the alloy layer containing magnesium and silver has low electric resistance, voltage applied to the second electrode is less likely to be lowered in the light-emitting element having a large emission area; thus, the light-emitting element can have less emission unevenness.

Embodiment 4

Figure 10C:
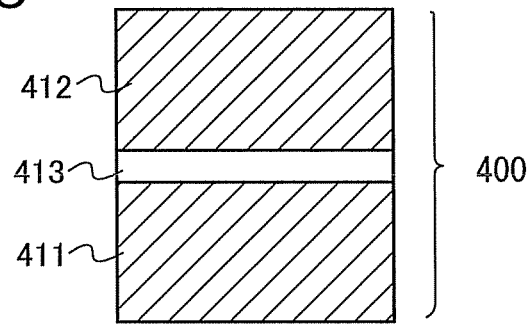

In this embodiment, a tandem organic EL layer 400 that can be used instead of the organic EL layer 200 in Embodiment 3 will be described with reference to FIG. 10C.

The tandem organic EL layer 400 is an organic EL layer having a structure in which a plurality of light-emitting units is stacked (hereinafter, referred to as tandem organic EL layer).

The organic EL layer 400 includes a first light-emitting unit 411 and a second light-emitting unit 412. Further, the structures of the first light-emitting unit 411 and the second light-emitting unit 412 may be the same or different from each other, and each of the structures can be similar to the structure described in Embodiment 3.

A charge generation layer 413 is provided between the first light-emitting unit 411 and the second light-emitting unit 412. The charge generation layer 413 has a function of injecting electrons to one side of the light-emitting unit and holes to the other side of the light-emitting unit, when voltage is applied between the first electrode 101 containing silver and the second electrode 102. The composite material of an organic compound and a metal oxide used for the charge generation layer 413 enables low-voltage driving and low-current driving because it is excellent in carrier-injection property and carrier-transport property.

As the hole-transport organic compound, an organic compound having a hole mobility of $1 \times 10^{-6}$ cm$^2$/Vs or higher is preferably used. For example, an aromatic amine derivative, a carbazole derivative, an aromatic hydrocarbon derivative, or an oligomer, a dendrimer, or a polymer containing any of the derivatives can be used. An oxide of a metal belonging to any of Groups 4 to 8 in the periodic table is preferable as the metal oxide mixed with such an organic compound; specifically, vanadium oxide, niobium oxide, tantalum oxide, chromium oxide, molybdenum oxide, tungsten oxide, manganese oxide, and rhenium oxide are preferable. Such metal oxides are preferable since they have high electron-accepting properties. In particular, molybdenum oxide is preferable because it is stable in the air, its hygroscopic property is low, and it can be easily handled.

The charge generation layer 413 may have a single-layer structure or a layered structure. For example, the charge generation layer 413 may have a structure in which a layer containing a composite material of an organic compound and a metal oxide and a layer containing one compound selected from electron-donating substances and a compound having a high electron-transport property are stacked; or a structure in which a transparent conductive layer and a layer containing a composite material of an organic compound and a metal oxide are stacked.

A plurality of light-emitting units partitioned by a charge generation layer is arranged between a pair of electrodes in the light-emitting element including the tandem organic EL layer 400 of this embodiment, and thus the light-emitting element including the tandem organic EL layer 400 can emit light with high luminance while the current density is kept low. Since the current density can be low, the light-emitting element can achieve high luminance and a long lifetime.

The methods and the like described in this embodiment can be combined as appropriate with any of the methods and the like described in the other embodiments.

Embodiment 5

In this embodiment, examples of an electronic device and a lighting device to which a light-emitting device manufactured by a method of manufacturing a light-emitting device according to one embodiment of the present invention is applied will be described with reference to FIGS. 11A to 11E and FIGS. 12A to 12C.

Examples of the electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like. Specific examples of these electronic devices are illustrated in FIGS. 11A to 11E.

Figure 11A:
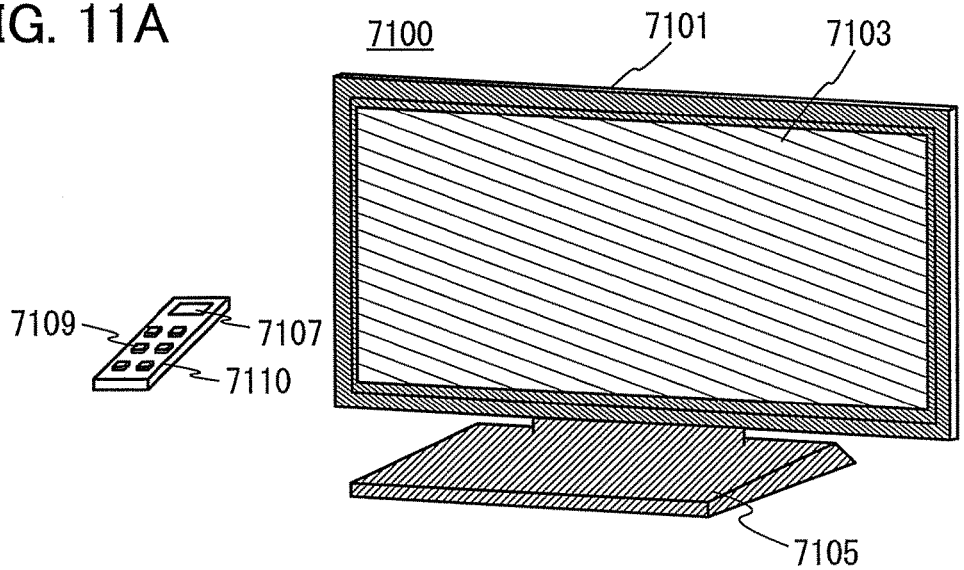
FIGS. 11A to 11E each illustrate an electronic device to which a light-emitting device according to one embodiment of the present invention is applied.

FIG. 11A illustrates an example of a television device. In the television device 7100, a display portion 7103 is incorporated in a housing 7101. Images can be displayed on the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 11B:
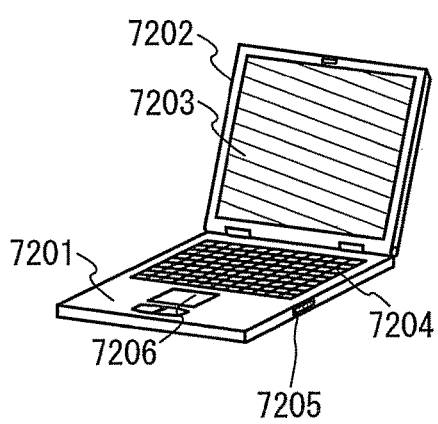

FIG. 11B illustrates a computer, which includes a main body 7201, a housing 7202, a display portion 7203, a keyboard 7204, an external connection port 7205, a pointing device 7206, and the like. This computer is manufactured by using a light-emitting device for the display portion 7203.

Figure 11C:
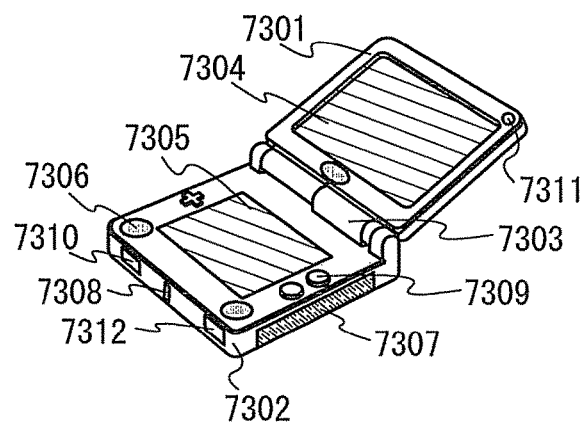

FIG. 11C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 11C includes a speaker portion 7306, a recording medium insertion portion 7307, an LED lamp 7308, an input unit (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. It is needless to say that the structure of the portable game machine is not limited to the above as long as a light-emitting device is used for at least either the display portion 7304 or the display portion 7305, or both, and may include other accessories as appropriate. The portable game machine illustrated in FIG. 11C has a function of reading a program or data stored in a recording medium to display it in the display portion, and a function of sharing information with another portable game machine by wireless communication. Note that the functions of the portable game machine illustrated in FIG. 11C are not limited to these functions, and the portable game machine can have various functions.

Figure 11D:
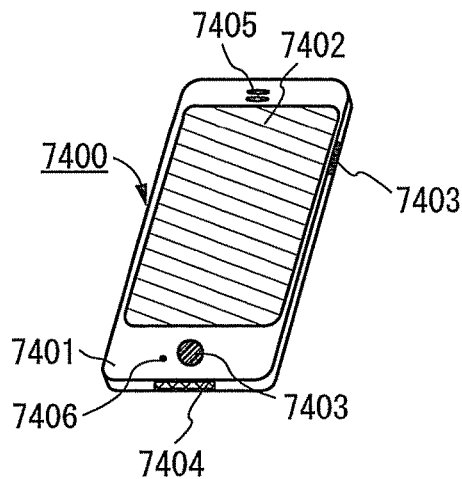

FIG. 11D illustrates an example of a cellular phone. The cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using the light-emitting device for the display portion 7402.

When the display portion 7402 of the cellular phone 7400 illustrated in FIG. 11D is touched with a finger or the like, data can be input into the cellular phone 7400. Further, operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is changed to the display mode. When the signal is a signal of text data, the screen mode is changed to the input mode.

Moreover, in the input mode, when input by touching the display portion 7402 is not performed within a specified period while a signal detected by an optical sensor in the display portion 7402 is detected, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 11E:
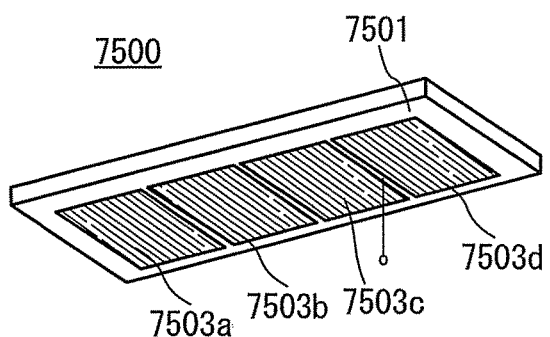

FIG. 11E illustrates an example of a lighting device. In a lighting device 7500, light-emitting devices 7503a, 7503b, 7503c, and 7503d manufactured by a manufacturing method according to one embodiment of the present invention are incorporated as light sources in a housing 7501. The lighting device 7500 can be attached to a ceiling, a wall, or the like.

Further, the light-emitting devices 7503a to 7503d each emit light having high brightness and a pale color and causing less eyestrain even in the case of long-time use, light of a bright red color, and light of a bright color different from the other colors. By adjusting conditions under which the light-emitting element is driven for each emission color, a lighting device whose hue can be adjusted by a user can be achieved.

Figure 12A:
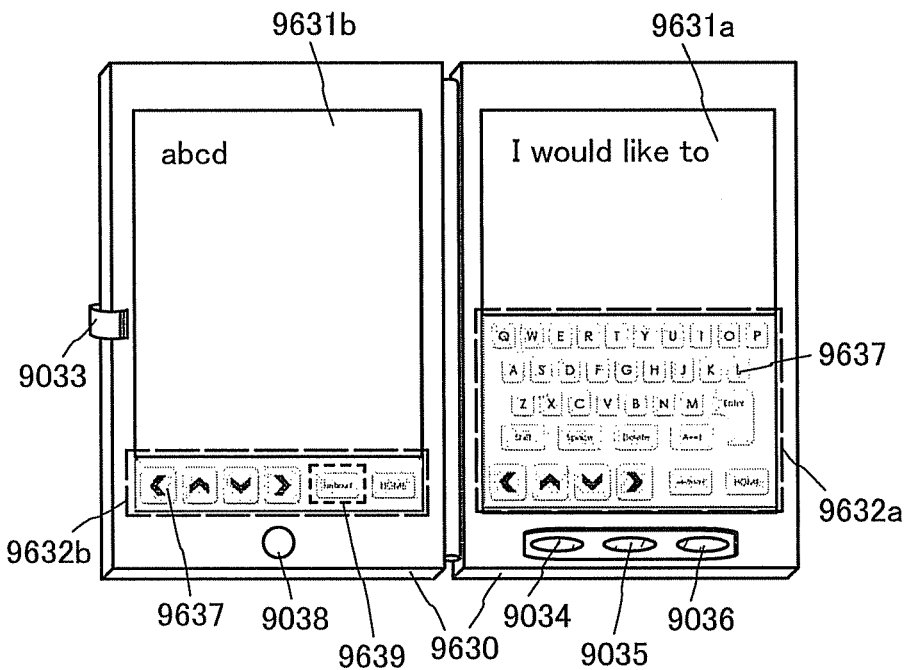
FIGS. 12A to 12C show an electronic device to which a light-emitting device according to one embodiment of the present invention is applied.
Figure 12B:
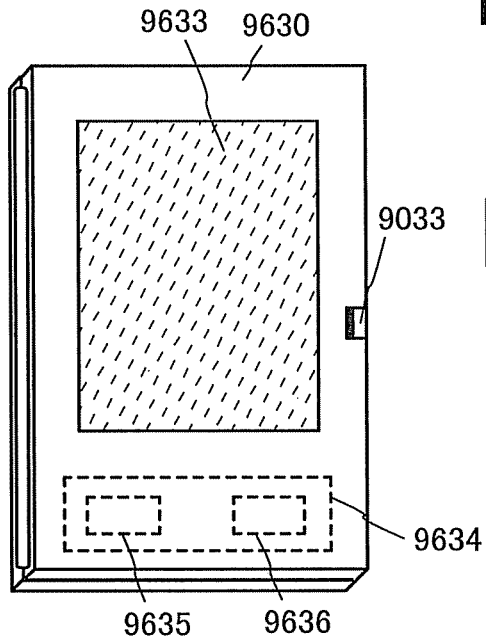

FIGS. 12A and 12B illustrate a tablet terminal that can be folded in two. FIG. 12A illustrates the tablet terminal in the state of being unfolded. The tablet terminal includes a housing 9630, a display portion 9631a, a display portion 9631b, a display-mode switch 9034, a power switch 9035, a power-saving-mode switch 9036, a fastener 9033, and an operation switch 9038. The tablet terminal is manufactured using the light-emitting device for either the display portion 9631a or the display portion 9631b or both.

Part of the display portion 9631a can be a touch panel region 9632a and data can be input when a displayed operation key 9637 is touched. Although a structure in which a half region in the display portion 9631a has only a display function and the other half region also has a touch panel function is shown as an example, the display portion 9631a is not limited to the structure. The whole region in the display portion 9631a may have a touch panel function. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Note that FIG. 12A shows an example in which the display portion 9631a and the display portion 9631b have the same display area; however, without limitation thereon, one of the display portions may be different from the other display portion in size and display quality. For example, one display panel may be capable of higher-definition display than the other display panel.

The tablet terminal is closed in FIG. 12B. The tablet terminal includes the housing 9630, a solar cell 9633, a charge and discharge control circuit 9634, a battery 9635, and a DCDC converter 9636. In FIG. 12B, a structure including the battery 9635 and the DCDC converter 9636 is illustrated as an example of the charge and discharge control circuit 9634.

Since the tablet terminal can be folded in two, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 12A and 12B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630, so that the battery 9635 can be charged efficiently. The use of a lithium ion battery as the battery 9635 is advantageous in downsizing or the like.

The structure and the operation of the charge and discharge control circuit 9634 illustrated in FIG. 12B will be described with reference to a block diagram in FIG. 12C. The solar cell 9633, the battery 9635, the DCDC converter 9636, a converter 9638, switches SW1 to SW3, and the display portion 9631 are illustrated in FIG. 12C, and the battery 9635, the DCDC converter 9636, the converter 9638, and the switches SW1 to SW3 correspond to the charge and discharge control circuit 9634 illustrated in FIG. 12B.

First, an example of the operation in the case where power is generated by the solar cell 9633 using external light is described. The voltage of power generated by the solar cell 9633 is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9638 so as to be a voltage needed for the display portion 9631. In addition, when display on, the display portion 9631 is not performed, the switch SW1 is turned off and the switch SW2 is turned on so that the battery 9635 may be charged.

Note that the solar cell 9633 is described as an example of a power generation means; however, without limitation thereon, the battery 9635 may be charged using another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

Figure 12C:
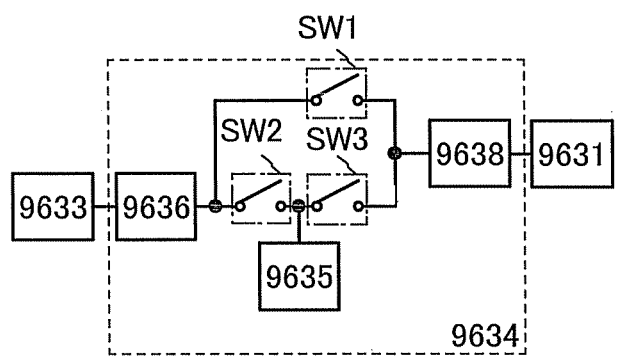

It is needless to say that one embodiment of the present invention is not limited to the electronic device illustrated in FIGS. 12A to 12C as long as the display portion described in the above embodiment is included.

The above-described electronic devices and lighting devices are light-emitting devices manufactured by a manufacturing method according to one embodiment of the present invention. Therefore, the electronic devices and lighting devices can have high reliability.

This embodiment can be combined with any of the other embodiments disclosed in this specification as appropriate.

This application is based on Japanese Patent Application serial no. 2011-260826 filed with Japan Patent Office on Nov. 29, 2011, the entire contents of which are hereby incorporated by reference.

What is claimed is:

1. A method of manufacturing a sealed body, comprising steps of:
   forming a frit glass layer along a continuous closed curve line over a first substrate;
   forming a reflective layer over a second substrate, the reflective layer comprising a first region, a second region and a third region;
   wherein the first region is provided in a corner region of the reflective layer,
   wherein the second region and the third region are provided in regions other than the corner region of the reflective layer,
   forming a first terminal and a second terminal over the reflective layer, the first terminal and the second terminal intersecting with the frit glass layer and the reflective layer;

disposing the first substrate and the second substrate so that entirety of the reflective layer is provided under the frit glass layer; and scanning and irradiating the frit glass layer with laser light to weld the frit glass layer to the second substrate, wherein each of the first region and the second region has lower reflectivity than the third region, wherein the first terminal and the second terminal extend in parallel with each other when seen from a top of the sealed body, wherein the frit glass layer and the reflective layer are provided between the first substrate and the second substrate, wherein the scanning is started from the second region and ended at the second region, and wherein an amount of heat from laser light applied to the second region is substantially equal to an amount of heat applied to each of the first region and the third region without adjusting irradiation intensity.

2. The method of manufacturing a sealed body, according to claim 1,
wherein each of the first region and the second region is provided with a hole, and
wherein a shape of the hole is square.

3. The method of manufacturing a sealed body, according to claim 1, wherein the reflective layer comprises at least one of tungsten, tantalum, molybdenum, copper and iron.

4. The method of manufacturing a sealed body, according to claim 1,
wherein a closed space is formed between the first substrate and the second substrate by welding the frit glass layer to the second substrate.

5. The method of manufacturing a sealed body, according to claim 1, further comprising a step of forming an insulating layer over the reflective layer,
wherein the insulating layer is in contact with the frit glass layer at the step of scanning and irradiating the frit glass layer.

6. The method of manufacturing a sealed body, according to claim 1, wherein the laser light passes through the first substrate and is reflected by the reflective layer.

7. The method of manufacturing a sealed body, according to claim 1, wherein a light-emitting element is formed over the second substrate.

8. A method of manufacturing a light-emitting device, comprising steps of:
forming a frit glass layer along a continuous closed curve line over a first substrate;
forming a reflective layer over a second substrate, the reflective layer comprising a first region, a second region and a third region;
wherein the first region is provided in a corner region of the reflective layer,
wherein the second region and the third region are provided in regions other than the corner region of the reflective layer,
forming a first terminal and a second terminal over the reflective layer, the first terminal and the second terminal intersecting with the frit glass layer and the reflective layer;
forming a light-emitting layer over the second substrate;
disposing the first substrate and the second substrate so that entirety of the reflective layer is provided under the frit glass layer; and
scanning and irradiating the frit glass layer with laser light to weld the frit glass layer to the second substrate,
wherein each of the first region and the second region has lower reflectivity than the third region,
wherein the first terminal and the second terminal extend in parallel with each other when seen from a top of the light-emitting device,
wherein the frit glass layer and the reflective layer are provided between the first substrate and the second substrate,
wherein the scanning is started from the second region and ended at the second region, and
wherein an amount of heat from laser light applied to the second region is substantially equal to an amount of heat applied to each of the first region and the third region without adjusting irradiation intensity.

9. The method of manufacturing a light-emitting device, according to claim 8,
wherein each of the first region and the second region is provided with a hole, and
wherein a shape of the hole is square.

10. The method of manufacturing a light-emitting device, according to claim 8, wherein the reflective layer comprises at least one of tungsten, tantalum, molybdenum, copper and iron.

11. The method of manufacturing a light-emitting device, according to claim 8,
wherein a closed space is formed between the first substrate and the second substrate by welding the fit glass layer to the second substrate.

12. The method of manufacturing a light-emitting device, according to claim 8, further comprising a step of forming an insulating layer over the reflective layer,
wherein the insulating layer is in contact with the frit glass layer at the step of scanning and irradiating the frit glass layer.

13. The method of manufacturing a light-emitting device, according to claim 8, wherein the laser light passes through the first substrate and is reflected by the reflective layer.

14. The method of manufacturing a sealed body, according to claim 1,
wherein the second region comprises a first hole,
wherein the third region comprises a second hole, and
wherein the first hole is larger than the second hole.

15. The method of manufacturing a light-emitting device, according to claim 8,
wherein the second region comprises a first hole,
wherein the third region comprises a second hole, and
wherein the first hole is larger than the second hole.

* * * * *